(12) United States Patent
Pelley

(10) Patent No.: US 9,934,846 B1
(45) Date of Patent: Apr. 3, 2018

(54) MEMORY CIRCUIT AND METHOD FOR INCREASED WRITE MARGIN

(71) Applicant: NXP USA, INC., Austin, TX (US)

(72) Inventor: Perry H. Pelley, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/446,338

(22) Filed: Mar. 1, 2017

(51) Int. Cl.
  *G11C 5/14* (2006.01)
  *G11C 11/419* (2006.01)
  *G11C 11/418* (2006.01)

(52) U.S. Cl.
  CPC ............ *G11C 11/419* (2013.01); *G11C 5/147* (2013.01); *G11C 11/418* (2013.01)

(58) Field of Classification Search
  None
  See application file for complete search history.

(56) References Cited

U.S. PATENT DOCUMENTS

| | | | | |
|---|---|---|---|---|
| 6,549,453 B2 * | 4/2003 | Wong | ............... | G11C 11/412 365/154 |
| 6,765,816 B2 | 7/2004 | Pelley | | |
| 6,781,870 B1 | 8/2004 | Kushida | | |
| 6,791,864 B2 * | 9/2004 | Houston | ............... | G11C 11/419 365/154 |
| 7,200,030 B2 * | 4/2007 | Yamaoka | ............... | G11C 11/417 365/154 |
| 7,292,495 B1 | 11/2007 | Kenkare et al. | | |
| 7,295,487 B2 | 11/2007 | Ramaraju et al. | | |
| 7,492,627 B2 | 2/2009 | Russell et al. | | |
| 7,502,275 B2 * | 3/2009 | Nii | ............... | G11C 5/063 365/154 |
| 7,542,369 B2 | 6/2009 | Kenkare et al. | | |
| 7,616,516 B2 * | 11/2009 | Hirayama | ............... | G11C 11/412 365/154 |
| 7,701,755 B2 * | 4/2010 | Chen | ............... | G11C 11/412 365/154 |
| 7,903,483 B2 * | 3/2011 | Russell | ............... | G11C 5/147 365/189.02 |
| 8,031,549 B2 | 10/2011 | Kenkare et al. | | |
| 8,120,975 B2 * | 2/2012 | Kenkare | ............... | G11C 11/419 365/154 |
| 8,345,470 B2 * | 1/2013 | Satomi | ............... | G11C 11/418 365/154 |

(Continued)

OTHER PUBLICATIONS

Karl, E., "A 0.6 V, 1.5 GHz 84 Mb SRAM in 14 nm FinFET CMOS Technology With Capacitive Charge-Sharing Write Assist Circuitry", IEEE Journal of Solid-State Circuits, vol. 51, No. 1, Jan. 2016.

(Continued)

*Primary Examiner* — Son Mai

(57) ABSTRACT

A memory circuit includes a plurality of bit-cells organized in a column. Each bit-cell of the plurality is coupled to first and second voltage supply terminals, and first and second bit-lines. A word-line is coupled to a bit-cell of the plurality and configured to receive a first voltage during a first write operation. A first voltage generation circuit is coupled to the first voltage supply terminal and is configured to provide a first reduced voltage during the first write operation. A second voltage generation circuit is coupled to the second voltage supply terminal and is configured to provide a second reduced voltage during the first write operation.

19 Claims, 5 Drawing Sheets

(56) References Cited

U.S. PATENT DOCUMENTS

| | | | |
|---|---|---|---|
| 8,995,208 B2* | 3/2015 | Jung | ................. G11C 11/413 |
| | | | 365/154 |
| 9,218,872 B1 | 12/2015 | Liaw | |
| 2008/0159014 A1 | 7/2008 | Dray et al. | |
| 2009/0059685 A1 | 3/2009 | Houston | |
| 2012/0044779 A1 | 2/2012 | Chuang et al. | |
| 2014/0003181 A1 | 1/2014 | Wang et al. | |
| 2014/0204687 A1 | 7/2014 | Sinangil et al. | |
| 2015/0170734 A1 | 6/2015 | Hwang et al. | |
| 2016/0372180 A1 | 12/2016 | Amara et al. | |

OTHER PUBLICATIONS

Keane., J., "5.6Mb/mm 1R1W SRAM Arrays Operating down to 560mV Utilizing Small-Signal Sensing with Charge-Shared Bitline and Asymmetric Sense Amplifier in 14nm FinFET CMOS Technology", IEEE International Solid-State Circuits Conference, 2016.
Notice of Allowance dated Feb. 23, 2018 in U.S. Appl. No. 15/446,323.

* cited by examiner

MEMORY CIRCUIT AND METHOD FOR INCREASED WRITE MARGIN

BACKGROUND

Field

This disclosure relates generally to memory circuits, and more specifically, to a memory circuit having increased write margin.

Related Art

As semiconductor process technology advances, integrated circuit feature sizes (e.g. transistor gate length) continue to decrease. With smaller feature sizes, integrated circuits can be higher performing and operate at lower voltages. Increasingly, newer generations of memories are using a lower supply voltage to reduce power consumption while taking advantage of smaller feature sizes. The lower supply voltage when used to write a memory, however, degrades the performance of memory bit-cells. For example, the lower supply voltage results in a lower write margin for the bit-cells. However, a lower supply voltage can be used for the memory if the bit-cell write margin can be improved. Thus, there is a need for a memory with an increased write margin.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an integrated circuit memory that includes column circuitry to selectively adjust bit-cell supply voltages and bit-line voltages during write operations. In one embodiment, the column circuitry includes voltage generation circuits to provide negatively boosted bit-cell supply voltages and bit-line voltages. By applying a full operating voltage (e.g., VDD) at a word-line coupled to a bit-cell having negatively boosted supply voltages, write margins can be increased. Negatively boosting a logic low bit-line voltage signal can further increase write margins.

Figure 1:
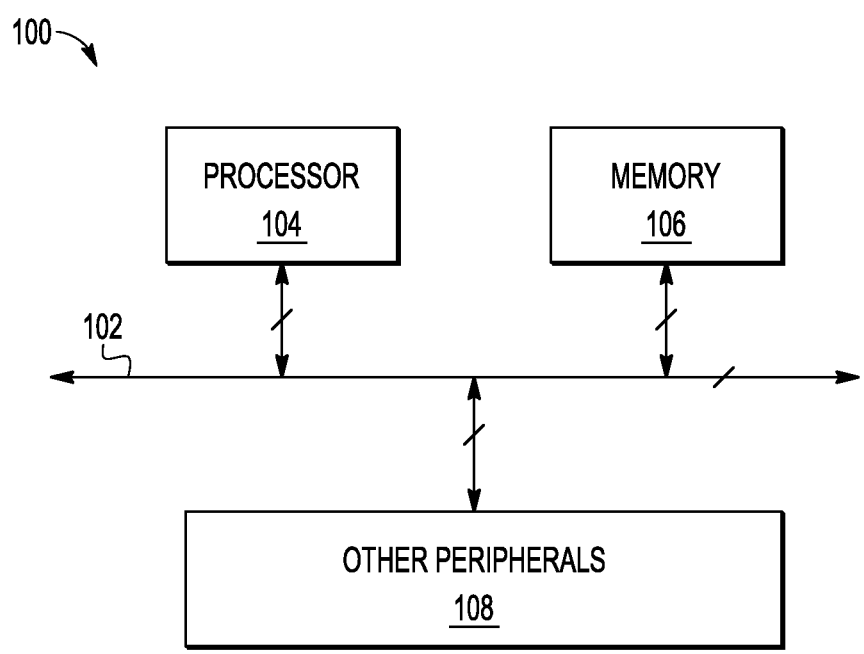
FIG. 1 illustrates, in simplified block diagram form, an exemplary integrated circuit in accordance with an embodiment of the present disclosure.

FIG. 1 illustrates, in simplified block diagram form, exemplary integrated circuit 100 in accordance with an embodiment of the present disclosure. In some embodiments, integrated circuit 100 may be characterized as a system-on-a-chip (SoC). Integrated circuit 100 includes a system bus 102, processor 104, memory 106, and other peripherals 108. Processor 104, memory 106, and other peripherals 108 are each bi-directionally coupled to system bus 102 by way of respective communication buses. In some embodiments, memory 106 may be formed on a die separate from a die including integrated circuit 100. In some embodiments, memory 106 may be formed as a stand-alone memory.

System bus 102 can be any type of bus for communicating any type of information such as address, data, instructions, clocks, and control. System bus 102 provides a communication backbone for communications among the processor 104, memory 106, and other peripherals 108.

Processor 104 may be any type of processor, including circuits for processing, computing, etc., such as a microprocessor (MPU), microcontroller (MCU), digital signal processor (DSP), or other type of processing core. Processing system 100 may include multiple processors like processor 104. Processor 104 is configured to execute instructions in order to carry out one or more designated tasks.

Memory 106 may include any suitable type of memory array, such as static random access memory (SRAM), for example. Memory 106 may also be coupled directly or tightly coupled to processor 104. Integrated circuit 100 may include multiple memories like memory 106 or a combination of different memories. For example, integrated circuit 100 may include a flash memory in addition to memory 106.

Other peripherals 108 of processing system 100 may include any number of other circuits and functional hardware blocks such as accelerators, timers, counters, communications, interfaces, analog-to-digital converters, digital-to-analog converters, PLLs, and the like for example. Other peripherals 108 are each bi-directionally coupled to system bus 102 by way of respective communication buses.

Figure 2:
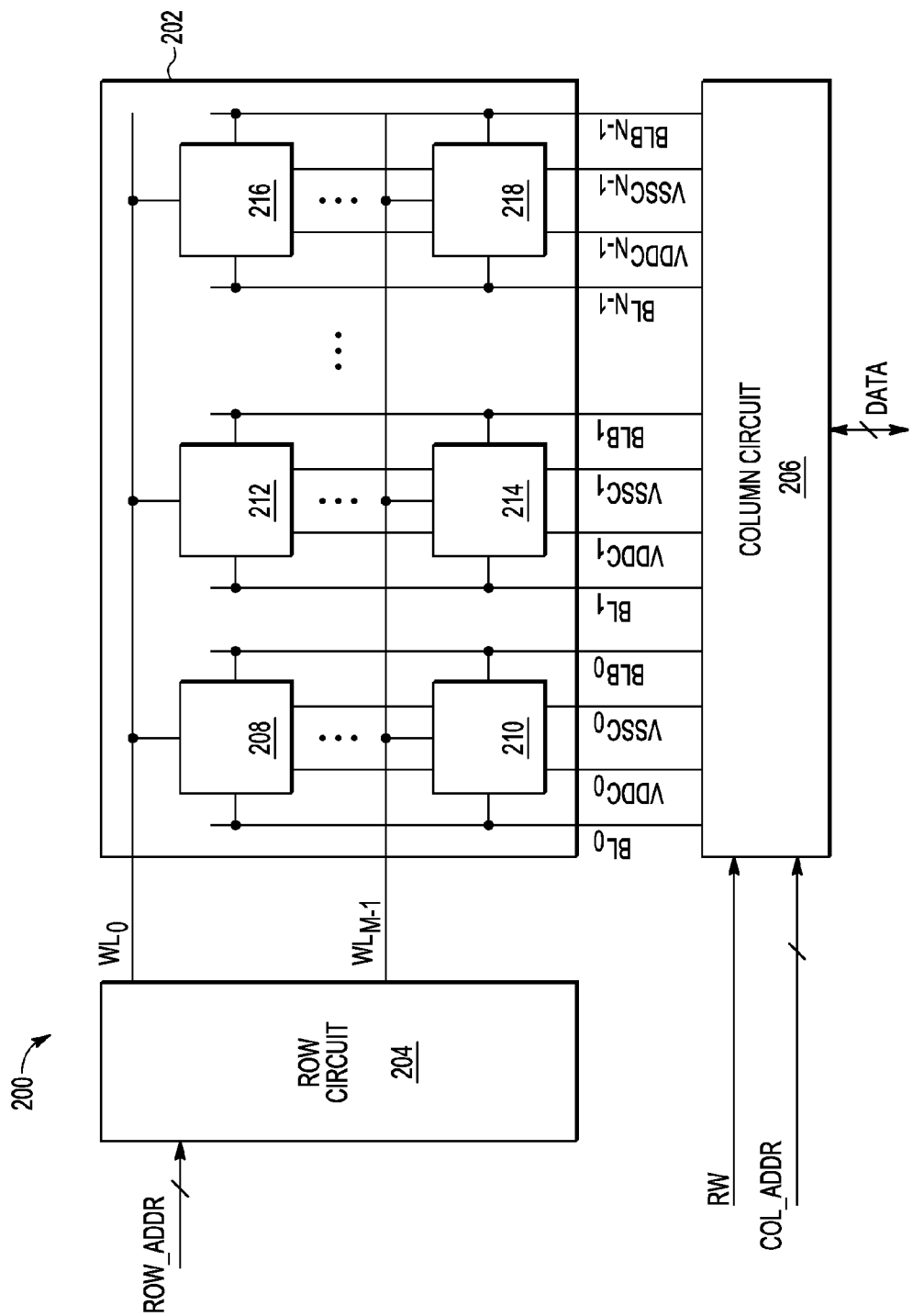
FIG. 2 illustrates, in simplified block diagram form, an exemplary memory circuit in accordance with an embodiment of the present disclosure.

FIG. 2 illustrates, in simplified block diagram form, an exemplary memory circuit 200 in accordance with an embodiment of the present disclosure. Memory circuit 200 may be a portion of a memory. For example, memory circuit 200 may be a portion of memory 106 coupled to processor 104 in integrated circuit 100. Memory circuit 200 may be implemented as a cache memory. Memory circuit 200 may also be implemented as a stand-alone memory, such as static random access memory (SRAM).

Memory circuit 200 includes bit-cell array 202, row circuit block 204, and column circuit block 206. Row circuit 204 and column circuit 206 are used to read and write data from and to bit-cells, such as bit-cells 208-218 of bit-cell array 202. Row circuit 204 receives row address (ROW_ADDR) signal from a processor, memory management unit (MMU), direct memory access (DMA) unit, or the like for example. Similarly, column circuit 206 receives column address (COL_ADDR) signal and RW signal from the processor, MMU, DMA, or the like for example. Column circuit 206 provides data and receives data (DATA) to and from the processor, for example. Row circuit 204 and column circuit 206 may include additional signals.

Bit-cell array 202 is organized in M number of rows (word-lines) by N number of columns (bit-line pairs). Row circuit 204 is coupled to provide word-line ($WL_0$-$W_{M-1}$) signals to bit-cell array 202. Word-line ($WL_0$-$W_{M-1}$) signals are used to access bit-cells coupled to a selected word-line. Column circuit 206 includes a plurality of read/write control circuits. Each read/write control circuit is coupled to provide signals such as VDDC, and VSSC. Column circuit 206 may also provide and/or receive other signals. Column circuit 206 is also coupled to write and read data to/from bit-cell array 202 by way of complementary bit-line pair (BL$_0$/BLB$_0$-BL$_{N-1}$/BLB$_{N-1}$) signals. For example, a read/write control circuit of column circuit 206 is coupled to provide VDDC$_0$, and VSSC$_0$ signals to bit-cells 208-210 arranged on a column corresponding to complementary bit-line pair BL$_0$/BLB$_0$.

Figure 3:
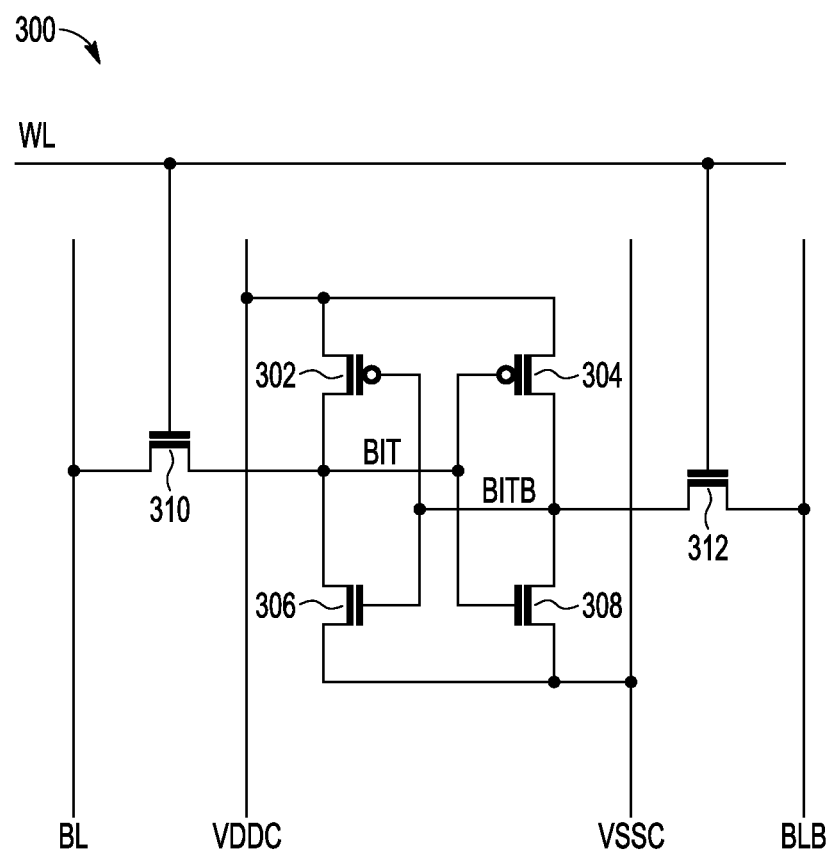
FIG. 3 illustrates, in simplified schematic diagram form, an exemplary memory bit-cell in accordance with an embodiment of the present disclosure.

FIG. 3 illustrates, in simplified schematic diagram form, exemplary memory bit-cell 300 in accordance with an embodiment of the present disclosure. In this embodiment, bit-cell 300 corresponds to bit-cells 208-218 of array 202. Bit-cell 300 is implemented as a six transistor (6T) cell. Bit-cell 300 includes P-channel pull-up transistors 302 and 304, N-channel pull-down transistors 306 and 308, and N-channel access transistors 310 and 312.

Transistors 302 and 306 are coupled in series between first and second voltage supply terminals labeled VDDC and VSSC respectively. A first current electrode of transistor 302 is coupled to the VDDC voltage supply terminal, a second current electrode of transistor 302 is coupled to a first current electrode of transistor 306, and a second current electrode of transistor 306 is coupled to the VSSC voltage supply terminal. A control electrode of transistor 302 is coupled to a control electrode of transistor 306. Likewise, transistors 304 and 308 are coupled in series between first and second voltage supply terminals, VDDC and VSSC respectively. A first current electrode of transistor 304 is coupled to the VDDC voltage supply terminal, a second current electrode of transistor 304 is coupled to a first current electrode of transistor 308, and control electrodes of transistors 302 and 306. A second current electrode of transistor 308 is coupled to the VSSC voltage supply terminal. A control electrode of transistor 304 is coupled to a control electrode of transistor 308, the second current electrode of transistor 302, and the first current electrode of transistor 306. Transistors 302-308 are arranged to form a storage element.

First access transistor 310 is coupled between the storage element formed by transistors 302-308 and bit-line labeled BL, and second access transistor 312 is coupled between the storage element formed by transistors 302-308 and complement bit-line labeled BLB. A first current electrode of transistor 310 is coupled to control electrodes of transistors 304 and 308, the second current electrode of transistor 302, and the first current electrode of transistor 306 at node labeled BIT. A second current electrode of transistor 310 is coupled to the bit-line BL, and a control electrode of transistor 310 is coupled to word-line signal labeled WL. Likewise, first current electrode of transistor 312 is coupled to control electrodes of transistors 302 and 306, the second current electrode of transistor 304, and the first current electrode of transistor 308 at node labeled BITB. A second current electrode of transistor 312 is coupled to the complement bit-line BLB, and a control electrode of transistor 312 is coupled to word-line signal WL.

Figure 4:
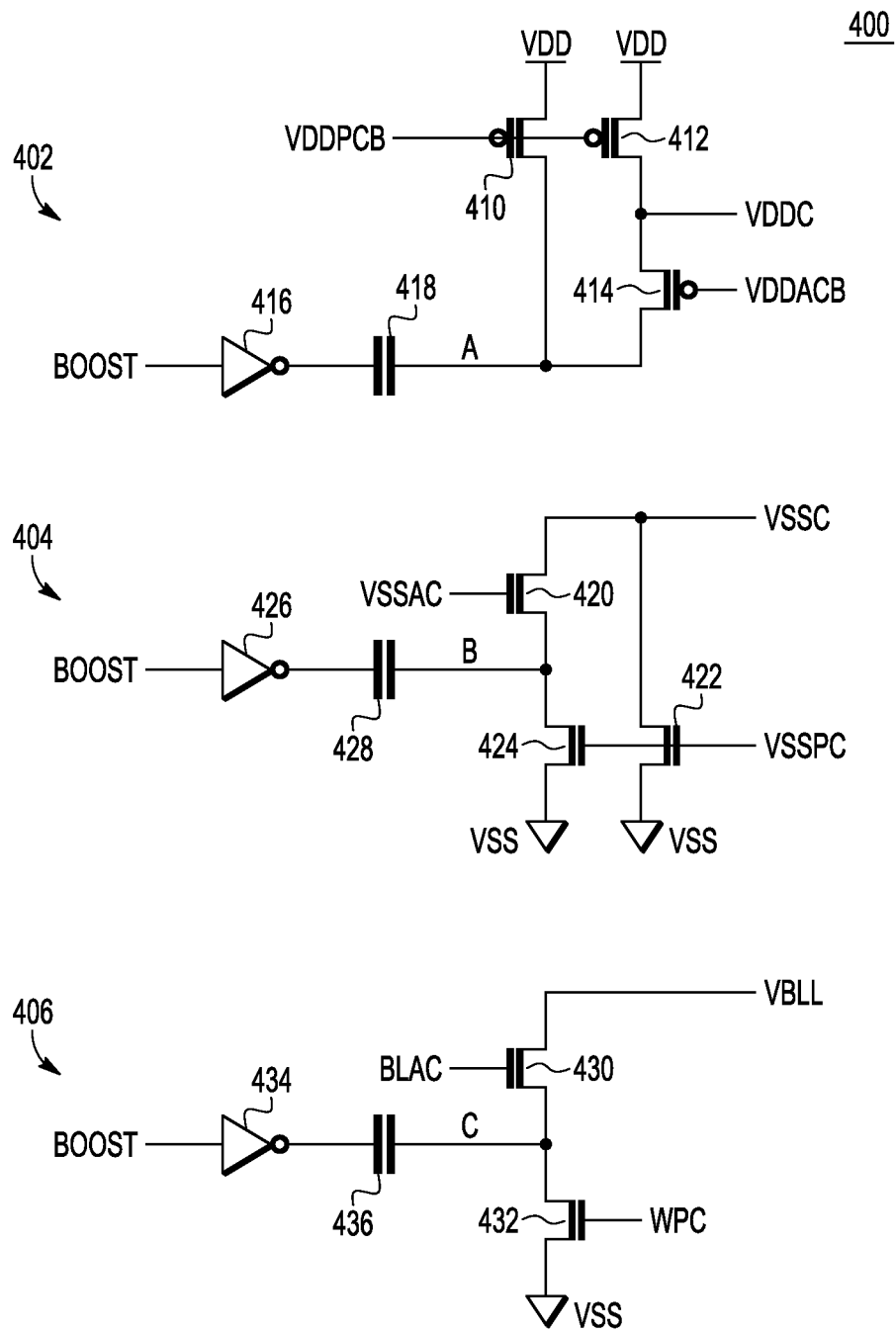
FIG. 4 illustrates, in simplified schematic diagram form, an exemplary control circuit portion of column circuit in accordance with an embodiment of the present disclosure.

FIG. 4 illustrates, in simplified schematic diagram form, an exemplary control circuit portion of column circuit 206 in accordance with an embodiment of the present disclosure. The control circuit portion 400 includes a VDDC voltage generation circuit 402, a VSSC voltage generation circuit 404, and a bit-line logic low (VBLL) voltage generation circuit 406. Generated VDDC and VSSC voltage signals are provided to bit-cells by way of VDDC and VSSC terminals. Generated VBLL voltage signal is provided to bit-cells by way of complementary bit-line pair BL/BLB. For example, during a write one operation, a logic high signal may be provided on bit-line BL while a logic low signal generated by VBLL voltage generation circuit 406 may be provided on complement bit-line BLB. In this embodiment, column circuit 206 includes a set of VDDC, VSSC, and VBLL voltage generation circuits coupled to each column of bit-cells respectively.

VDDC voltage generation circuit 402 includes P-channel transistors 410 412, and 414, inverter 416, and capacitor 418. VDDC voltage generation circuit 402 receives a boost signal BOOST, a boost access signal VDDACB, and a pre-charge signal VDDPCB, and provides an output voltage signal (VDDC) at output labeled VDDC. A first current electrode of transistor 410 is coupled to VDD voltage supply terminal, a second current electrode of transistor 410 is coupled to a first current electrode of transistor 414 and a first terminal of capacitor 418 at node labeled A. A first current electrode of transistor 412 is coupled to VDD voltage supply terminal, a second current electrode of transistor 412 is coupled to a second current electrode of transistor 414 and to the VDDC output. Control electrodes of transistors 410 and 412 are coupled to receive the VDDPCB signal. A control electrode of transistor 414 is coupled to receive the VDDACB signal. An input of inverter 416 is coupled to receive the BOOST signal and an output of inverter 416 is coupled to a second terminal of capacitor 418.

VSSC voltage generation circuit 404 includes N-channel transistors 420, 422, and 424, inverter 426, and capacitor 428. VSSC voltage generation circuit 404 receives a boost signal BOOST, a boost access signal VSSAC, and a pre-charge signal VSSPC, and provides an output voltage signal (VSSC) at output labeled VSSC. A first current electrode of transistor 420 is coupled to the VSSC output and to a first current electrode of transistor 422. A second current electrode of transistor 420 is coupled to a first current electrode of transistor 424 and a first terminal of capacitor 428 at node labeled B. A control electrode of transistor 420 is coupled to receive the VSSAC signal. Second current electrodes of transistors 422 and 424 are each coupled to VSS voltage supply terminal and control electrodes of transistors 422 and 424 are each coupled to receive the VSSPC signal. An input of inverter 426 is coupled to receive the BOOST signal and an output of inverter 426 is coupled to a second terminal of capacitor 428.

VBLL voltage generation circuit 406 includes N-channel transistors 430 and 432, inverter 434, and capacitor 436. VBLL voltage generation circuit 406 receives a boost signal BOOST, a boost access signal BLAC, and a pre-charge signal WPC, and provides an output voltage signal (VBLL) at output labeled VBLL. A first current electrode of transistor 430 is coupled to the VBLL output, a second current electrode of transistor 430 is coupled to a first current electrode of transistor 432 and a first terminal of capacitor 436 at node labeled C. A control electrode of transistor 430 is coupled to receive the BLAC signal. A second current electrode of transistor 432 is coupled to VSS voltage supply terminal and a control electrode of transistor 432 is coupled to receive the WPC signal. An input of inverter 434 is coupled to receive the BOOST signal and an output of inverter 434 is coupled to a second terminal of capacitor 436.

In this embodiment, a VDD voltage and a VSS voltage are provided at VDD and VSS terminals respectively. VDD voltage may be characterized as a nominal operating voltage of memory circuit 200 and VSS may be characterized as a ground voltage. For example, memory circuit 200 having a bit-cell array implemented as 6T bit-cells and fabricated in an exemplary process technology node may have a nominal operating voltage (VDD) at 0.8 volts. Accordingly, VDDC may be negatively boosted to approximately 0.6 volts and VSSC may be negatively boosted to approximately −0.2 volts. Likewise, VBLL may be negatively boosted to approximately −0.2 volts. The amount of negative boost may be adjusted based on capacitance values of capacitors 418, 428, and 436.

Figure 5:
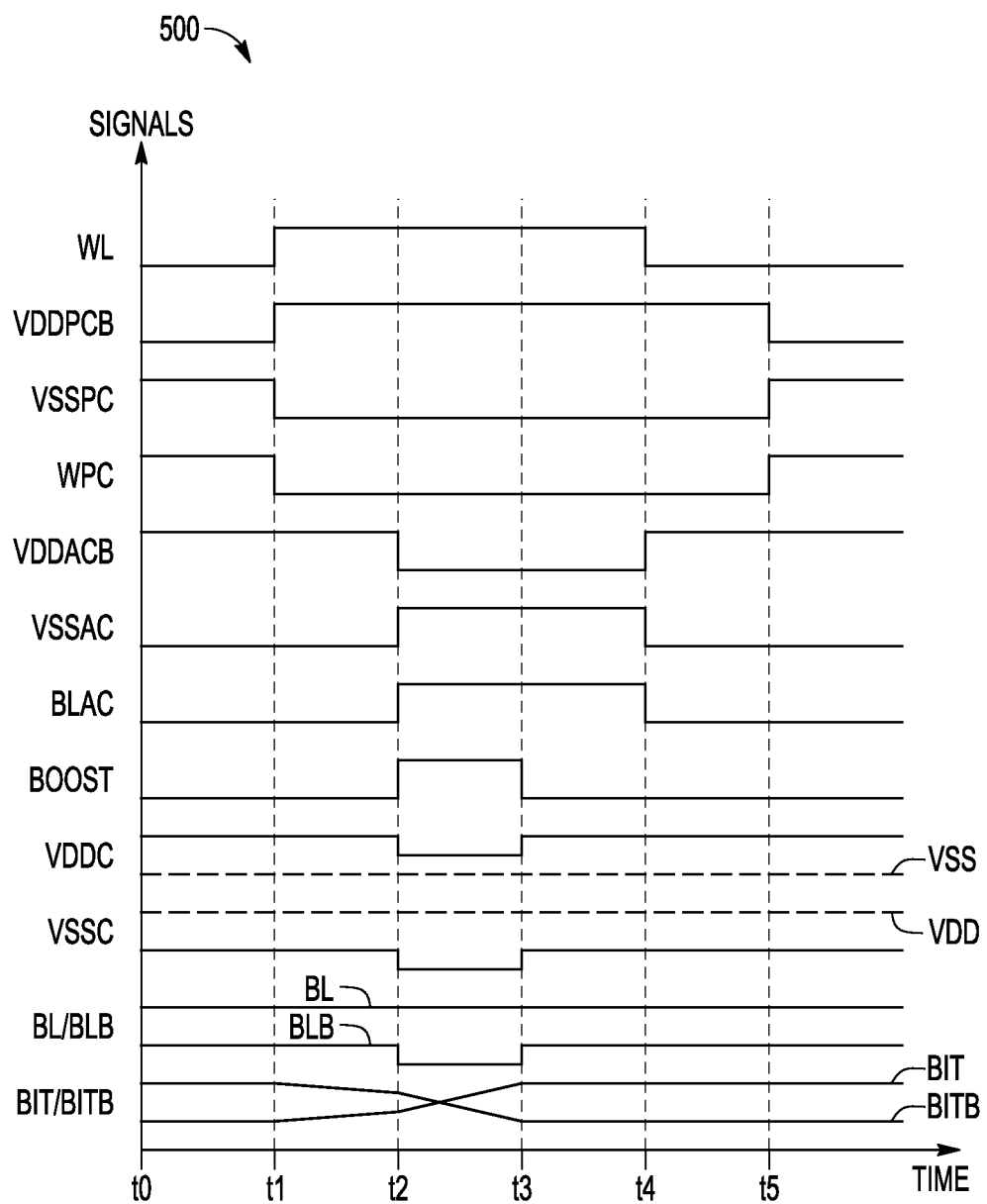
FIG. 5 illustrates, in timing diagram form, exemplary control signal timing for write operation in accordance with an embodiment of the present disclosure.

FIG. 5 illustrates, in timing diagram form, exemplary control signal timing for write operation in accordance with an embodiment of the present disclosure. Timing diagram 500 includes various signal waveforms versus time for a write operation consistent with the exemplary read/write control circuit portion 400 of column circuit 206 illustrated in FIG. 4. By way of example, signal timing for a writing a logic "1" value to a bit-cell (e.g., bit-cell 300) follows.

At time t0, VDDC voltage generation circuit 402, VSSC voltage generation circuit 404, and VBLL voltage generation circuit 406 are in a pre-charge state of a write 1 operation. Pre-charge signals VSSPC, and WPC are asserted as a logic high level and complement pre-charge signal VDDPCB is asserted as a logic low level. During the pre-charge state, node A is pre-charged to a VDD voltage level and nodes B and C are pre-charged to a VSS voltage level (e.g., ground), initializing voltage across capacitors 418, 428, and 436 respectively. VDDC and VSSC outputs are pre-charged to VDD and VSS voltages respectively, by way of transistors 412 and 422. During the pre-charge state, word-line signal WL is de-asserted as a logic low level, inhibiting access to the bit-cell. Boost signal BOOST is de-asserted as a logic low level during the pre-charge state. Bit-line BL is pre-charged to a logic high VDD voltage level and complement bit-line BLB is pre-charged a logic low VSS level. Bit-line BL and complement bit-line BLB are each configured to receive respective pre-charged voltages for a pre-determined amount of time before or between write operations. A logic low level at node labeled BIT and a logic high level at complementary node labeled BITB indicate a logic "0" value is stored in the bit-cell.

At time t1, VDDPCB, VSSPC, and WPC pre-charge signals are de-asserted ending pre-charge state of voltage generation circuits 402, 404, and 406. After pre-charge ends, word-line signal WL is asserted as a logic high at VDD voltage level to begin a write access of the bit-cell by way of transistors 310 and 312 (FIG. 3). True and complementary data values are provided at complementary bit-line pair BL/BLB respectively. In this embodiment for the write 1 operation, the VDD voltage level is applied at BL and the VSS voltage is applied at BLB accordingly. With WL signal asserted, access to the bit-cell is enabled causing voltage signals on BL and BLB to begin transitioning BIT and BITB storage node voltages respectively.

At time t2, a negative boost stage of the write 1 operation is initiated. Boost access signals VDDACB, VSSAC, and BLAC are asserted causing VDDC, VSSC, and VBLL to charge share with capacitors 418, 428, and 436 respectively. Boost signal BOOST is asserted as a logic high level further negatively boosting VDDC, VSSC, and VBLL by way of capacitors 418, 428, and 436. As a result, VDDC is reduced to a first reduced voltage, VSSC is reduced to a second reduced voltage, and VBLL is reduced to a third reduced voltage.

The first reduced voltage corresponds to pre-charged VDD voltage minus a first reduction voltage caused by charge sharing with capacitor 418. For example, the first reduced voltage at the VDDC terminal would be approximately 0.6 volts given a VDD voltage of 0.8 volts and a first reduction voltage of approximately 0.2 volts. The second reduced voltage corresponds to pre-charged VSS (ground) voltage minus a second reduction voltage caused by charge sharing with capacitor 428. For example, the second reduced voltage at the VSSC terminal would be approximately −0.2 volts given a VSS voltage of 0.0 volts or ground and a second reduction voltage of approximately 0.2 volts.

Likewise, the third reduced voltage corresponds to VSS voltage minus a third reduction voltage caused by charge sharing with capacitor 436. For example, the third reduced voltage at the VBLL output would be approximately −0.2 volts given a VSS voltage of 0.0 volts and a third reduction voltage of approximately 0.2 volts. In this embodiment, the VBLL voltage generation circuit is coupled to provide logic low voltage for the logic low signal portion of complementary bit-line pair BL/BLB.

By reducing the respective voltages supplied at VDDC and VSSC terminals of the storage element of the bit-cell, the trip point or point at which the input voltage causes the storage element to change state, is lowered. For example, for a logic "0" value stored in the storage element of the bit-cell, the switch point is characterized as a bit-line voltage sufficient to cause the bit-cell to change to a logic "1" value. Because the word-line is at VDD voltage while the storage element switch point is lowered, little or no voltage drop results across access transistor 310 (coupled to bit-line BL at logic high level) and thus, write margin is enhanced. Because the logic low voltage provided at the bit-line BLB is reduced below VSS, write margin is further enhanced. The foregoing margin enhancements can allow BIT and BITB nodes to expeditiously complete transitioning to the corresponding logic "1" value, for example.

At time t3, boost signal BOOST is de-asserted ending the negative boost stage and causing capacitors 418, 428, and 436 to restore charge to VDDC, VSSC, and VBLL respectively. Because charge is returned to VDDC, VSSC, and VBLL, power can be conserved. Voltages at BIT and BITB nodes of the storage element have completed transitioning and correspond to a logic "1" value written to the bit-cell.

At time t4, word-line WL is de-asserted ending the write access of the bit-cell by way of transistors 310 and 312. In turn, boost access signals VDDACB, VSSAC, and BLAC are de-asserted, isolating capacitors 418, 428, and 436 from VDDC, VSSC, and VBLL respectively. At time t5, pre-charge signals VDDPCB, VSSPC, and WPC are asserted, beginning a pre-charge state for a next operation.

Generally, there is provided, a memory circuit including a first plurality of bit-cells organized in a first column, each bit-cell of the first plurality coupled to a first voltage supply terminal, a second voltage supply terminal, a first bit-line, and a second bit-line; a first word-line coupled to a first bit-cell of the first plurality, the first word-line configured to receive a first voltage during a first write operation; a first voltage generation circuit coupled to a first power supply terminal and the first voltage supply terminal, the first voltage generation circuit configured to provide a first reduced voltage at the first voltage supply terminal during the first write operation, the first reduced voltage being lower than the first voltage; and a second voltage generation circuit coupled a second power supply terminal and to the second voltage supply terminal, the second voltage generation circuit configured to provide at the second voltage supply terminal a second reduced voltage during the first write operation. The first bit-line may be configured to receive the first voltage during the first write operation, and wherein the second bit-line may be configured to receive a third reduced voltage during the first write operation. The memory circuit may further include a third voltage generation circuit coupled to provide the third reduced voltage at the second bit-line during the first write operation. The memory circuit may further include a second plurality of bit-cells organized in a second column, each bit-cell of the second plurality coupled to a third voltage supply terminal, a fourth voltage supply terminal, a third bit-line, and a fourth bit-line; a fourth voltage generation circuit coupled to the first power supply terminal and the third voltage supply terminal, the fourth voltage generation circuit configured to provide at the third voltage supply terminal the first voltage during the first write operation and the first reduced voltage during a second write operation; and a fifth voltage generation circuit coupled the second power supply terminal and to the fourth voltage supply terminal, the fifth voltage generation circuit configured to provide at the fourth voltage supply terminal a second voltage during the first write operation and the second reduced voltage during the second write operation; wherein the first word-line is coupled to a second bit-cell of the second plurality, the first word-line configured to receive the first voltage during the second write operation. The first bit-line and the second bit-line may be configured to receive the first voltage and ground voltage in a complementary manner for a pre-determined amount of time between the first write operation and the second write operation. The bit-cells of the first and second pluralities may be characterized as 6-T memory cells. The first voltage generation circuit may include a first transistor having a first current electrode coupled to the first power supply terminal, a second current electrode coupled to the first voltage supply terminal, and a control electrode coupled to receive a first control signal; and a first capacitor having a first terminal coupled to a second control signal, and a second terminal coupled to the first voltage supply terminal. The second voltage generation circuit may include a second transistor having a first current electrode coupled to the second power supply terminal, a second current electrode coupled to the second voltage supply terminal, and a control electrode coupled to receive a third control signal; and a second capacitor having a first terminal coupled to the second control signal, and a second terminal coupled to the second voltage supply terminal. The first reduced voltage may be approximately 0.2 volts lower than the first voltage. The second reduced voltage may be approximately 0.2 volts lower than ground voltage.

In another embodiment, there is provided, a memory circuit including a first power supply terminal to provide a first supply voltage; a second power supply terminal to provide a second supply voltage; a first plurality of bit-cells organized in a first column, each bit-cell of the first plurality coupled to a first voltage supply terminal, a second voltage supply terminal, a first bit-line, and a second bit-line; a first word-line coupled to a first bit-cell of the first plurality, the first word-line configured to receive the first supply voltage during a first write operation; a first voltage generation circuit coupled to the first power supply terminal and the first voltage supply terminal, the first voltage generation circuit configured to provide a first reduced voltage at the first voltage supply terminal during the first write operation, the first reduced voltage being lower than the first supply voltage; and a second voltage generation circuit coupled to the second power supply terminal and the second voltage supply terminal, the second voltage generation circuit configured to provide a second reduced voltage at the second voltage supply terminal during the first write operation, the second reduced voltage being lower than the second supply voltage. The first voltage generation circuit may include a first transistor having a first current electrode coupled to the first power supply terminal, a second current electrode coupled to the first voltage supply terminal, and a control electrode coupled to receive a first control signal; a second transistor having a first current electrode coupled to the first voltage supply terminal, a second current electrode, and a control electrode coupled to receive a second control signal; and a first capacitor having a first terminal coupled to a third control signal, and a second terminal coupled to the second current electrode of the second transistor. Responsive to the second control signal, the first voltage generation circuit may be configured to provide the first reduced voltage by charge sharing the first voltage supply terminal with the first capacitor. The first bit-line may be configured to receive the first voltage during the first write operation, and wherein the second bit-line is configured to receive a third reduced voltage during the first write operation. The memory circuit may further include a third voltage generation circuit coupled to provide the third reduced voltage at the second bit-line during the first write operation. The third reduced voltage may be approximately 0.2 volts lower than ground voltage. The bit-cells of the first plurality may be characterized as 6-T memory cells, and wherein the first bit-line and the second bit-line may be together characterized as a complementary bit-line pair.

In yet another embodiment, there is provided, a method including providing a first plurality of bit-cells organized in a first column, each bit-cell of the first plurality having a storage element coupled to a pair of access transistors, the storage element including a first supply terminal and a second supply terminal; coupling a word-line to a first bit-cell of the first plurality by way of control electrodes of the pair of access transistors; applying a first voltage to the word-line to enable a first write operation of the first bit-cell; during the first write operation: reducing the first voltage at the first supply terminal to a first reduced voltage; reducing a second voltage at the second supply terminal to a second reduced voltage; and storing a first data value in the first bit-cell based on a third voltage applied at a first bit-line and a fourth voltage applied at a second bit-line, the first and second bit-lines coupled to respective access transistors of each bit-cell of the first plurality. During the first write operation, the third voltage may be substantially equal to the first voltage and the fourth voltage may be reduced to a third reduced voltage. The third reduced voltage may be approximately 0.2 volts lower than ground voltage.

By now it should be appreciated that there has been provided, an integrated circuit memory that includes column circuitry to selectively adjust bit-cell supply voltages and bit-line voltages during write operations. In one embodiment, the column circuitry includes voltage generation circuits to provide negatively boosted bit-cell supply voltages and bit-line voltages. By applying a full operating voltage (e.g., VDD) at a word-line coupled to a bit-cell having negatively boosted supply voltages, write margins can be increased. Negatively boosting a logic low bit-line voltage signal can further increase write margins.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name, an asterix (*) following the name, or the letter "B" at the end of the signal name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory circuit, comprising:
   a first plurality of bit-cells organized in a first column, each bit-cell of the first plurality coupled to a first voltage supply terminal, a second voltage supply terminal, a first bit-line, and a second bit-line;
   a first word-line coupled to a first bit-cell of the first plurality, the first word-line configured to receive a first voltage during a first write operation;
   a first voltage generation circuit coupled to a first power supply terminal and the first voltage supply terminal, the first voltage generation circuit configured to provide a first reduced voltage at the first voltage supply terminal during the first write operation, the first reduced voltage being lower than the first voltage, the first voltage generation circuit comprising:
      a first transistor having a first current electrode coupled to the first power supply terminal, a second current electrode coupled to the first voltage supply terminal, and a control electrode coupled to receive a first control signal, and
      a first capacitor having a first terminal coupled to a second control signal, and a second terminal coupled to the first voltage supply terminal; and
   a second voltage generation circuit coupled a second power supply terminal and to the second voltage supply terminal, the second voltage generation circuit configured to provide at the second voltage supply terminal a second reduced voltage during the first write operation.

2. The memory circuit of claim 1, wherein the first bit-line is configured to receive the first voltage during the first write operation, and wherein the second bit-line is configured to receive a third reduced voltage during the first write operation.

3. The memory circuit of claim 2, further comprising:
   a third voltage generation circuit coupled to provide the third reduced voltage at the second bit-line during the first write operation.

4. The memory circuit of claim 1, further comprising:
   a second plurality of bit-cells organized in a second column, each bit-cell of the second plurality coupled to a third voltage supply terminal, a fourth voltage supply terminal, a third bit-line, and a fourth bit-line;
   a fourth voltage generation circuit coupled to the first power supply terminal and the third voltage supply terminal, the fourth voltage generation circuit configured to provide at the third voltage supply terminal the first voltage during the first write operation and the first reduced voltage during a second write operation; and a fifth voltage generation circuit coupled the second power supply terminal and to the fourth voltage supply terminal, the fifth voltage generation circuit configured to provide at the fourth voltage supply terminal a second voltage during the first write operation and the second reduced voltage during the second write operation;

wherein the first word-line is coupled to a second bit-cell of the second plurality, the first word-line configured to receive the first voltage during the second write operation.

5. The memory circuit of claim 4, wherein the first bit-line and the second bit-line are configured to receive the first voltage and ground voltage in a complementary manner for a pre-determined amount of time between the first write operation and the second write operation.

6. The memory circuit of claim 4, wherein the bit-cells of the first and second pluralities are characterized as 6-T memory cells.

7. The memory circuit of claim 1, wherein the second voltage generation circuit includes:
a second transistor having a first current electrode coupled to the second power supply terminal, a second current electrode coupled to the second voltage supply terminal, and a control electrode coupled to receive a third control signal; and
a second capacitor having a first terminal coupled to the second control signal, and a second terminal coupled to the second voltage supply terminal.

8. The memory circuit of claim 1, wherein the first reduced voltage is approximately 0.2 volts lower than the first voltage.

9. The memory circuit of claim 1, wherein the second reduced voltage is approximately 0.2 volts lower than ground voltage.

10. A memory circuit, comprising:
a first power supply terminal to provide a first supply voltage;
a second power supply terminal to provide a second supply voltage;
a first plurality of bit-cells organized in a first column, each bit-cell of the first plurality coupled to a first voltage supply terminal, a second voltage supply terminal, a first bit-line, and a second bit-line;
a first word-line coupled to a first bit-cell of the first plurality, the first word-line configured to receive the first supply voltage during a first write operation;
a first voltage generation circuit coupled to the first power supply terminal and the first voltage supply terminal, the first voltage generation circuit configured to provide a first reduced voltage at the first voltage supply terminal during the first write operation, the first reduced voltage being lower than the first supply voltage; and
a second voltage generation circuit coupled to the second power supply terminal and the second voltage supply terminal, the second voltage generation circuit configured to provide a second reduced voltage at the second voltage supply terminal during the first write operation, the second reduced voltage being lower than the second supply voltage.

11. The memory circuit of claim 10, wherein the first voltage generation circuit includes:
a first transistor having a first current electrode coupled to the first power supply terminal, a second current electrode coupled to the first voltage supply terminal, and a control electrode coupled to receive a first control signal;
a second transistor having a first current electrode coupled to the first voltage supply terminal, a second current electrode, and a control electrode coupled to receive a second control signal; and
a first capacitor having a first terminal coupled to a third control signal, and a second terminal coupled to the second current electrode of the second transistor.

12. The memory circuit of claim 11, wherein responsive to the second control signal, the first voltage generation circuit is configured to provide the first reduced voltage by charge sharing the first voltage supply terminal with the first capacitor.

13. The memory circuit of claim 10, wherein the first bit-line is configured to receive the first voltage during the first write operation, and wherein the second bit-line is configured to receive a third reduced voltage during the first write operation.

14. The memory circuit of claim 13, further comprising:
a third voltage generation circuit coupled to provide the third reduced voltage at the second bit-line during the first write operation.

15. The memory circuit of claim 13, wherein the third reduced voltage is approximately 0.2 volts lower than ground voltage.

16. The memory circuit of claim 10, wherein the bit-cells of the first plurality are characterized as 6-T memory cells, and wherein the first bit-line and the second bit-line are together characterized as a complementary bit-line pair.

17. A method comprising:
providing a first plurality of bit-cells organized in a first column, each bit-cell of the first plurality having a storage element coupled to a pair of access transistors, the storage element including a first supply terminal and a second supply terminal;
coupling a word-line to a first bit-cell of the first plurality by way of control electrodes of the pair of access transistors;
applying a first voltage to the word-line to enable a first write operation of the first bit-cell;
during the first write operation:
reducing the first voltage at the first supply terminal to a first reduced voltage;
reducing a second voltage at the second supply terminal to a second reduced voltage; and
storing a first data value in the first bit-cell based on a third voltage applied at a first bit-line and a fourth voltage applied at a second bit-line, the first and second bit-lines coupled to respective access transistors of each bit-cell of the first plurality.

18. The method of claim 17, wherein during the first write operation, the third voltage is substantially equal to the first voltage and the fourth voltage is reduced to a third reduced voltage.

19. The memory circuit of claim 18, wherein the third reduced voltage is approximately 0.2 volts lower than ground voltage.

\* \* \* \* \*